United States Patent
Lee et al.

(10) Patent No.: US 11,138,938 B2
(45) Date of Patent: Oct. 5, 2021

(54) GATE DRIVING CIRCUIT AND DISPLAY DEVICE

(71) Applicant: LG Display Co., Ltd., Seoul (KR)

(72) Inventors: JongHyuck Lee, Paju-si (KR); Donghyang Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/897,811

(22) Filed: Jun. 10, 2020

(65) Prior Publication Data

US 2021/0090503 A1 Mar. 25, 2021

(30) Foreign Application Priority Data

Sep. 24, 2019 (KR) .................. 10-2019-0117716

(51) Int. Cl.
| | | |
|---|---|---|
| *G09G 3/32* | (2016.01) | |
| *G09G 5/00* | (2006.01) | |
| *G09G 3/3266* | (2016.01) | |
| *G09G 3/3275* | (2016.01) | |
| *G09G 3/3233* | (2016.01) | |
| *H01L 27/32* | (2006.01) | |

(52) U.S. Cl.
CPC ......... *G09G 3/3266* (2013.01); *G09G 3/3233* (2013.01); *G09G 3/3275* (2013.01); *H01L 27/3225* (2013.01); *H01L 27/3276* (2013.01); *G09G 2310/0213* (2013.01); *G09G 2340/0407* (2013.01)

(58) Field of Classification Search
CPC .. G09G 3/32; G09G 3/30; G09G 5/00; G09G 5/02; H01L 27/32; G06F 3/038
See application file for complete search history.

(56) References Cited

U.S. PATENT DOCUMENTS

| | | | | |
|---|---|---|---|---|
| 2007/0046884 | A1* | 3/2007 | An ..................... | G02F 1/1345 349/151 |
| 2013/0113766 | A1* | 5/2013 | Kim .................. | G09G 3/3648 345/205 |
| 2017/0075418 | A1* | 3/2017 | Zhou ................ | G09G 5/003 |
| 2019/0005884 | A1* | 1/2019 | Yoo .................. | G09G 3/3266 |
| 2019/0280057 | A1* | 9/2019 | Li .................... | H01L 51/5284 |
| 2019/0318693 | A1* | 10/2019 | Jung ................ | G09G 3/3266 |

(Continued)

FOREIGN PATENT DOCUMENTS

CN 107610635 A 1/2018

OTHER PUBLICATIONS

Combined Search and Examination Report, UK Patent Application No. GB2014917.5, dated Mar. 8, 2021, six pages.

*Primary Examiner* — Pegeman Karimi
(74) *Attorney, Agent, or Firm* — Fenwick & West LLP

(57) ABSTRACT

Provided are a gate driver and a display device. A low-resolution area is disposed in a portion of an active area, and an optical sensor is disposed on a side of the low-resolution area opposite to a surface of the low-resolution area on which an image is displayed, such that the display device displays images on the low-resolution area and performs sensing using the optical sensor. The low-resolution area and a high-resolution area surrounding the low-resolution area are driven using different gate lines. Image compensation for the low-resolution area is easily performed to reduce or remove the difference in the image quality between the low-resolution area and the surrounding areas.

17 Claims, 11 Drawing Sheets

(56) References Cited

U.S. PATENT DOCUMENTS

2020/0052059 A1* 2/2020 Chen .................... H01L 27/3213
2020/0058726 A1* 2/2020 Ma ...................... H01L 27/3216
2020/0357863 A1* 11/2020 Nakamura .......... H01L 27/3279
2020/0363907 A1* 11/2020 Heo .................... G02F 1/13452

* cited by examiner

FIG.2
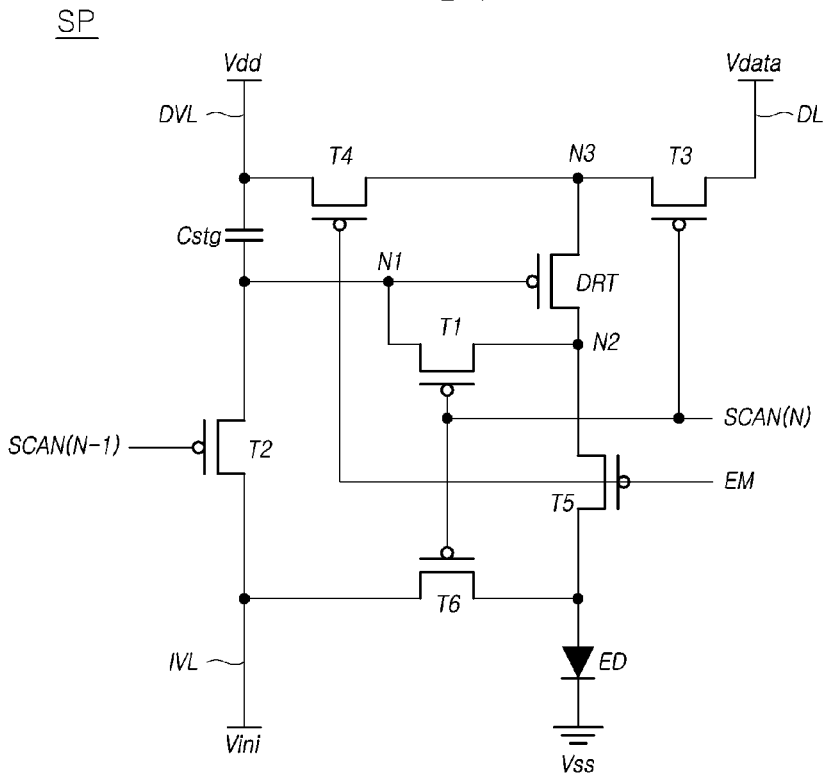
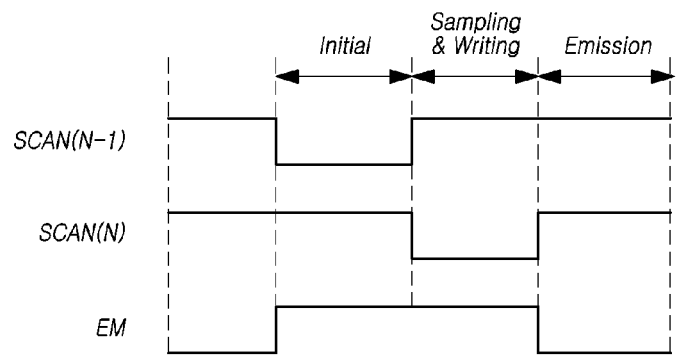

FIG.4
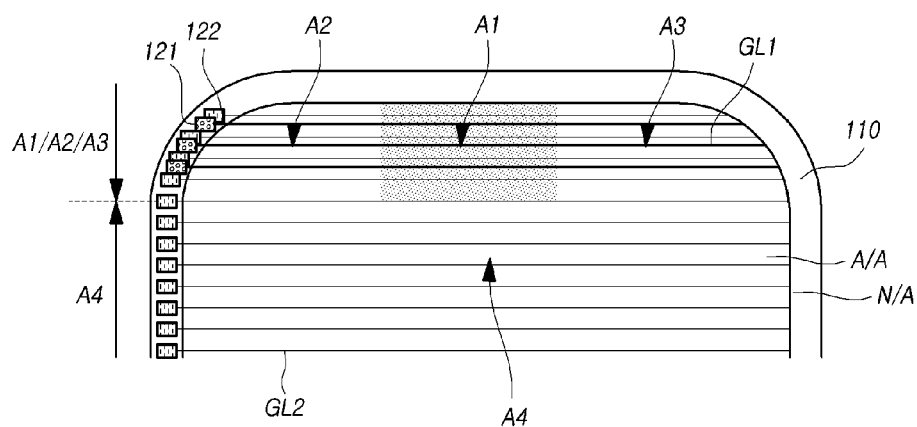
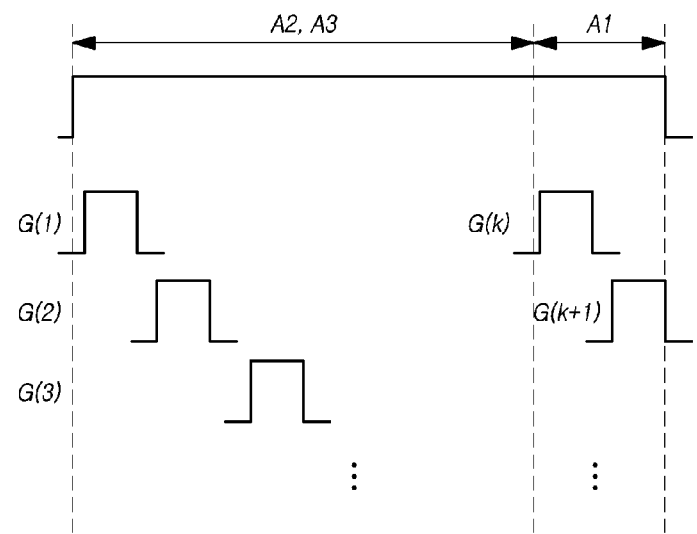

Transparent Area

FIG.9B

Transparent Area

Transparent Area

GATE DRIVING CIRCUIT AND DISPLAY DEVICE

CROSS REFERENCE TO RELATED APPLICATION

This application claims priority from Republic of Korea Patent Application No. 10-2019-0117716, filed on Sep. 24, 2019, which is hereby incorporated by reference in its entirety.

BACKGROUND

Field

Embodiments relate to a gate driver and a display device.

Description of Related Art

Along with the development of the information society, demand for display devices for displaying images is increasing. In this regard, a range of display devices, such as liquid crystal display (LCD) devices and organic light-emitting diode (OLED) display devices, have recently come into widespread use.

Such display devices may include a display panel in which a plurality of gate lines, a plurality of data lines, and a plurality of subpixels are disposed, as well as a variety of driving circuits driving the gate lines, the data lines, and the like. In addition, the display panel may include an active area with the plurality of subpixels being disposed therein to display images and a non-active area located outside of the active area, with signal lines or the like being disposed in the non-active area.

Here, a display device may include a camera sensor, a proximity sensor, or the like (hereinafter, referred to as an "optical sensor") disposed in the non-active area depending on the type of the display device. In a case in which the optical sensor is disposed in the non-active area, the ability to reduce the size of the non-active area in the display panel is limited.

To overcome such a problem, a method of disposing an optical sensor or the like required for the display device in a portion of the active area of the display panel has been attempted. However, since the optical sensor is disposed in the active area, the quality of images displayed on the active area may be reduced.

SUMMARY

Embodiments provide a scheme for enabling an optical sensor required for a display device to be disposed in an active area of a display panel while reducing degradation of the quality of images displayed by the display panel.

Embodiments provide a scheme for reducing a difference in the image quality between an area in which an optical sensor is disposed and an area in which no optical sensor is disposed in an active area of a display panel.

According to an aspect, embodiments provide a display device including an active area including a first area having first resolution and a second area located on one side of the first area and having second resolution higher than the first resolution. In some cases, the active area may further include a third area located on the other side of the first area and having the second resolution.

Here, the display device may further include at least one optical sensor disposed in an area overlapping the first area and located on a side opposite to a surface of the first area on which an image is displayed.

The display device may include: a plurality of first gate lines electrically connected to circuit elements disposed in subpixels of the first area and extending in a first direction; and a plurality of second gate lines electrically connected to circuit elements disposed in subpixels of the second area and extending in a second direction intersecting the first direction.

In addition, a first gate driver driving the plurality of first gate lines may be located on a first side of the active area, and a second gate driver driving the plurality of second gate lines may be located on a second side of the active area different from the first side.

Alternatively, the display device may include: a plurality of first gate lines electrically connected to circuit elements disposed in subpixels of the first area and insulated from circuit elements disposed in subpixels of the second area; and a plurality of second gate lines insulated from the circuit elements disposed in the subpixels of the first area and electrically connected to the circuit elements disposed in the subpixels of at least one area of the second area.

In this case, the first gate lines and the second gate lines may extend in a single direction. In addition, a first gate driver driving the first gate lines and a second gate driver driving the second gate lines may be located on a single side of sides of the active area.

According to another aspect, embodiments provide a gate driver including: a first gate driver driving a plurality of first gate lines electrically connected to circuit elements disposed in subpixels of a first area having first resolution; and a second gate driver driving a plurality of second gate lines electrically connected to circuit elements disposed in subpixels of a second area having second resolution higher than the first resolution, the plurality of second gate lines extending in a direction intersecting the plurality of first gate lines.

According to exemplary embodiments, the transmissivity of a specific area of the active area of the display panel is increased by reducing the resolution of the specific area, such that an optical sensor may be disposed on a surface of the low-resolution area opposite to an image display surface of the low-resolution area, so that sensing may be performed.

Accordingly, the ratio of the active area in the display panel may be maximized, and sensing using the optical sensor and image display may be performed in the specific area of the active area.

In addition, since the low-resolution area in which the optical sensor is disposed and the high-resolution area without the optical sensor may be driven through separate gate lines, compensation for the low-resolution area may be performed, thereby minimizing the difference in the image quality between the area in which the optical sensor is disposed and the surrounding area.

BRIEF DESCRIPTION OF THE DRAWINGS

The above and other objects, features, and advantages of the present disclosure will be more clearly understood from the following detailed description, taken in conjunction with the accompanying drawings, in which:

FIG. 2 illustrates a circuit structure of each of the subpixels in the display device according to embodiments, as well as driving times of the subpixel;

FIGS. 4 and 5 illustrate a structure in which gate lines for driving subpixels in the first area and subpixels in the areas other than the first area are disposed in the active area of the display device according to embodiments;

FIGS. 9A to 9C illustrate arrangement structures of the subpixels in the first area of the active area of the display device according to embodiments.

DETAILED DESCRIPTION

Figure 1:
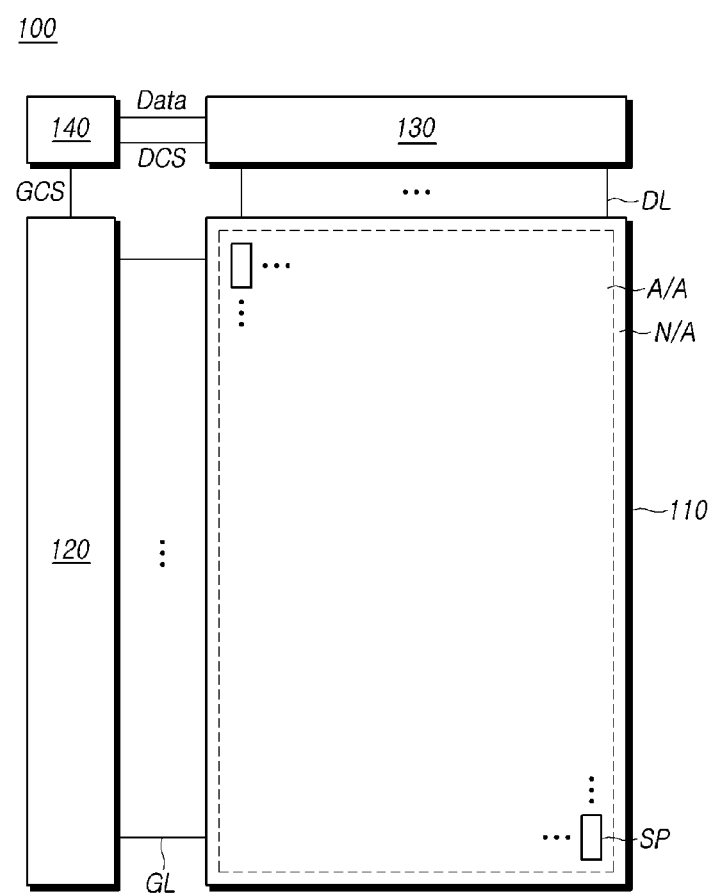
FIG. 1 illustrates a schematic configuration of a display device according to embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 illustrates a schematic configuration of a display device 100 according to embodiments.

Referring to FIG. 1, the display device 100 according to embodiments may include a display panel 110 in which a plurality of subpixels SP are arranged, and a gate driver 120, a data driver 130, a controller 140, and the like for driving the display panel 110.

The display panel 110 may include an active area A/A with the plurality of subpixels SP being disposed to display images and a non-active area N/A located outside of the active area, with signal lines or the like being disposed in the non-active area N/A.

A plurality of gate lines GL and a plurality of data lines DL may be disposed in the active area A/A of the display panel 110, and a plurality of subpixels SP may be disposed in areas in which the gate lines GL intersect the data lines DL.

Each of the subpixels SP may include an emitting device ED, and two or more subpixels SP may constitute a single pixel.

The gate driver 120 is controlled by the controller 140, and controls driving times of the plurality of subpixels SP by sequentially outputting a scan signal to the plurality of gate lines GL disposed in the display panel 110.

The gate driver 120 may include one or more gate driver integrated circuits (GDICs), and may be located on one side or both sides of the display panel 110 depending on the driving method.

The data driver 130 receives image data from the controller 140, and converts image data to an analog data voltage. In addition, the data driver 130 outputs the data voltage to each of the data lines DL at points in time at which the scan signal is applied through the gate lines GL, so that the subpixels SP exhibit luminous intensities corresponding to the image data.

The data driver 130 may include one or more source driver integrated circuits (SDICs).

The controller 140 supplies a variety of control signals to the gate driver 120 and the data driver 130 to control operations of the gate driver 120 and the data driver 130.

The controller 140 controls the gate driver 120 to output the scan signal at points in time defined by frames. The controller 140 converts image data into a data signal format readable by the data driver 130 by receiving the image data from an external source and outputs the converted image data to the data driver 130.

The controller 140 receives a variety of timing signals, in addition to the image data, from an external source (e.g., a host system). The timing signals may include a vertical synchronization signal Vsync, a horizontal synchronization signal Hsync, an input data enable signal DE, a clock signal CLK, and the like.

The controller 140 may generate a variety of control signals in accordance with the variety of timing signals received from the external source and output the control signals to the gate driver 120 and the data driver 130.

For example, the controller 140 outputs a variety of gate control signals GCS, including a gate start pulse GSP, a gate shift clock signal GSC, a gate output enable signal GOE, and the like, to control the gate driver 120.

Here, the gate start pulse GSP controls operation start times of the one or more GDICs of the gate 120. The gate shift clock GSC is a clock signal commonly input to the one or more GDICs to control shift times of the scan signal. The gate output enable signal GOE designates timing information of the one or more GDICs.

In addition, the controller 140 outputs a variety of data control signals DCS, including a source start pulse SSP, a source sampling clock SSC, a source output enable signal SOE, and the like, to control the data driver 130.

Here, the source start pulse SSP controls data sampling start times of the one or more SDICs of the data driver 130. The source sampling clock SSC is a clock signal controlling sampling times of data in each of the SDICs. The source output enable signal SOE controls output times of the data driver 130

The display device 100 may further include a power management integrated circuit (PMIC) supplying various forms of voltage or current to the display panel 110, the gate driver 120, the data driver 130, and the like, or controls various types of voltage or current to be supplied thereto.

Voltage lines through which a variety of signals or voltages are supplied, may be disposed on the display panel 110, in addition to the gate lines GL and the data lines DL. An emitting device ED, transistors for driving the emitting device ED, and the like may be disposed in each of the subpixels SP.

FIG. 2 illustrates a circuit structure of each of the subpixels SP in the display device 100 according to embodiments, as well as driving times of the subpixel SP.

Referring to FIG. 2, an emitting device ED may be disposed in the subpixel SP of the display panel 110. In addition, a driving transistor DRT driving the emitting device ED by current control may be disposed in the subpixel SP.

The emitting device ED disposed in the subpixel SP may be an organic light-emitting diode (OLED), and in some cases, may be a light-emitting diode (LED), a micro light-emitting diode (nLED), or the like.

In addition, in the subpixel SP, one or more transistors may be disposed in addition to the driving transistor DRT. A storage capacitor Cstg or the like for maintaining the voltage of the gate node of the driving transistor DRT may also be disposed in the subpixel SP.

FIG. 2 illustrates a 7T1C structure in which seven 7 transistors including the driving transistor DRT and one 1 storage capacitor Cstg are disposed in the subpixel SP. However, the structure of the subpixel SP in the display device 100 according to embodiments is not limited thereto. In addition, although FIG. 2 illustrates the subpixel SP being implemented as a P-type metal-oxide-semiconductor (PMOS) transistor, at least one of the transistors disposed in the subpixel SP may be implemented as an N-type metal-oxide-semiconductor (NMOS).

The emitting device ED may include an anode electrically connected to the driving transistor DRT and a cathode to which a base voltage Vss is supplied.

The driving transistor DRT may electrically connect a driving voltage line DVL through which a driving voltage Vdd is applied and the emitting device ED. In addition, the driving transistor DRT may be electrically connected to a data line DL through which a data voltage Vdata is applied. In addition, the gate node of the driving transistor DRT may be electrically connected to the storage capacitor Cstg and an initialization voltage line WL.

A first transistor T1 may be controlled by a scan signal SCAN(N) and may be electrically connected to a first node N1 and a second node N2 of the driving transistor DRT. The first transistor T1 may control a voltage obtained by compensating for the data voltage Vdata with a threshold voltage Vth of the driving transistor DRT to be applied to the gate node of the driving transistor DRT.

A second transistor T2 may be controlled by a scan signal SCAN(N−1) and electrically connect the first node N1 of the driving transistor DRT and the initialization voltage line WL. The second transistor T2 may be used to initialize the voltage of the gate node of the driving transistor DRT.

A third transistor T3 may be controlled by the scan signal SCAN(N) and electrically connect a third node N3 of the driving transistor DRT and the data line DL. In addition, a fourth transistor T4 may be controlled by a scan signal EM and electrically connect the third node N3 of the driving transistor DRT and the driving voltage line DVL.

A fifth transistor T5 may be controlled by the scan signal EM and electrically connect the second node N2 of the driving transistor DRT and the emitting device ED. The fifth transistor T5 may control emission times of the emitting device ED.

A sixth transistor T6 may be controlled by the scan signal SCAN(N) and electrically connect the anode of the emitting device ED and the initialization voltage line WL. The sixth transistor T6 may be used to initialize the voltage of the anode of the emitting device ED.

Describing the driving method of the subpixel SP, the subpixel SP may be driven such that a driving period thereof is divided into an initialization period, a data writing period, and an emission period during a single image frame period.

During the initialization period, the scan signal SCAN(N−1) having a low level may be supplied to the subpixel SP, thereby turning the second transistor T2 on. As the second transistor T2 is turned on, an initialization voltage Vini may be applied to the gate node of the driving transistor DRT.

After the completion of the initialization, during the data writing period, the scan signal SCAN(N−1) having a high level and the scan signal SCAN(N) having a low level may be supplied to the subpixel SP. In addition, the second transistor T2 may be turned off, while the first transistor T1, the third transistor T3, and the sixth transistor T6 may be turned on.

As the first transistor T1 is turned on, the first node N1 and the second node N2 of the driving transistor DRT are electrically connected.

In addition, as the third transistor T3 is turned on, the data voltage Vdata may be applied to the first node N1, the gate node, of the driving transistor DRT through the driving transistor DRT and the first transistor T1. At this time, the voltage obtained by reflecting the threshold voltage Vth of the driving transistor DRT to the data voltage Vdata may be applied to the gate node of the driving transistor DRT, so that compensation for the threshold voltage of the driving transistor DRT may be performed.

In addition, as the sixth transistor T6 is turned on during the data writing period, the anode of the emitting device ED may be initialized by the initialization voltage Vini. That is, both an operation of applying a voltage to the gate node of the driving transistor DRT and an operation of initializing the anode of the emitting device ED may be simultaneously performed during the data writing period.

During the emission period, the scan signal SCAN(N−1) having a high level and the scan signal SCAN(N) having a high level may be supplied to the subpixel SP, and the scan signal EM having a low level may be supplied to the subpixel SP. Consequently, the first transistor T1, the third transistor T3, and the sixth transistor T6 may be turned off, while the fourth transistor T4 and the fifth transistor T5 may be turned on.

As the fourth transistor T4 is turned on, the driving voltage Vdd may be supplied to the third node N3 of the driving transistor DRT, and a difference in the voltage between the first node N1 and the third node N3 of the driving transistor DRT may be created by the data voltage Vdata and the driving voltage Vdd, so that a current in response to the data voltage Vdata may flow through the driving transistor DRT.

As the fifth transistor T5 is turned on, the current in response to the data voltage Vdata may be supplied to the emitting device ED, and the emitting device ED may exhibit a luminous intensity corresponding to the data voltage Vdata.

Such subpixels SP may be disposed at predetermined distances from each other in the active area A/A of the display panel 110 or the same number of subpixels SP may be disposed in a unit area, such that the display panel 110 has uniform resolution.

In some cases, the subpixels SP may be disposed such that a portion of the active area A/A has a different level of resolution. In this case, the transmissivity of an area having lower resolution may be increased, and an optical sensor or the like may be disposed in the area having the increased transmissivity to perform sensing. That is, the active area A/A may include an area accommodating the optical sensor while displaying images.

Figure 3:
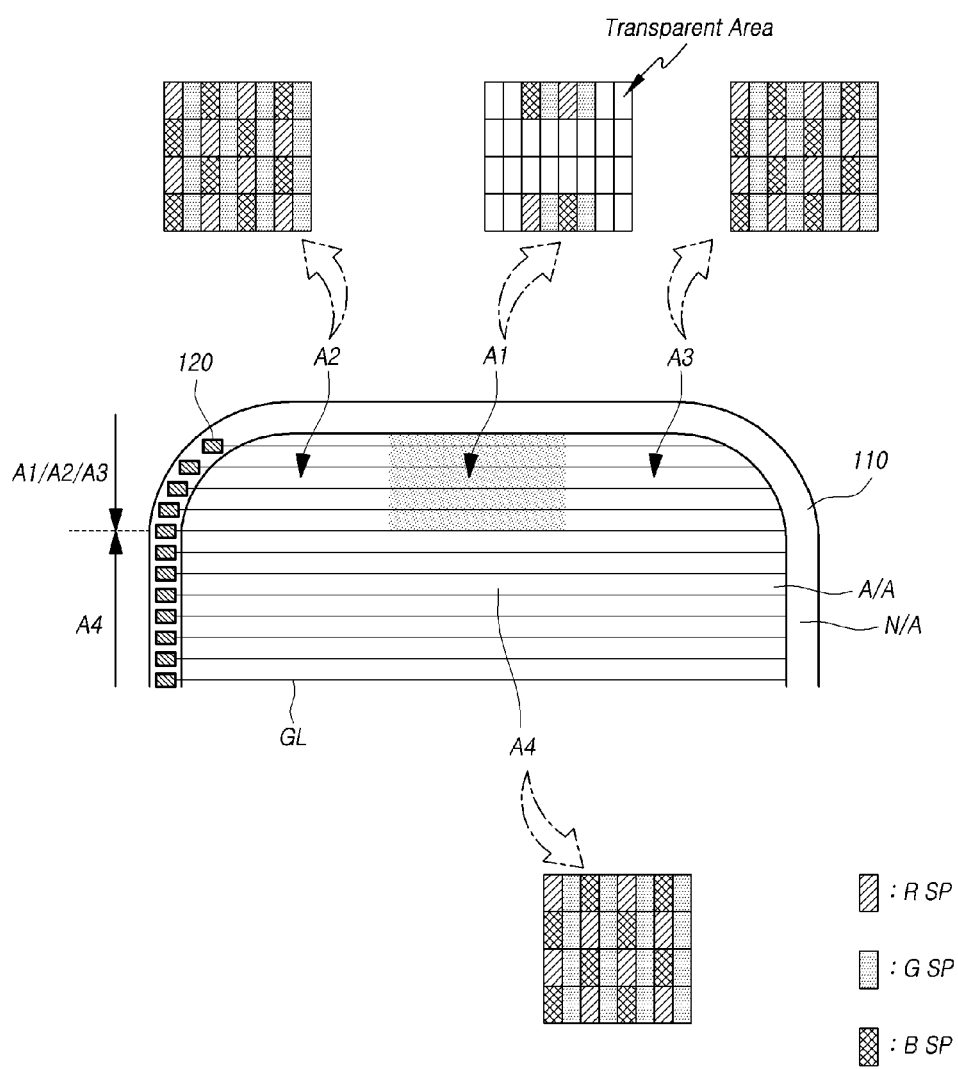
FIG. 3 illustrates a structure in which the subpixels and the gate lines are disposed in the active area of the display device according to embodiments, with an optical sensor being disposed in the active area.

FIG. 3 illustrates a structure in which the subpixels SP and the gate lines GL are disposed in the active area A/A of the display device 100 according to embodiments, with an optical sensor being disposed in the active area A/A.

Referring to FIG. 3, the display panel 110 may include the active area A/A with a plurality of subpixels SP being disposed therein to display images and a non-active area N/A located outside of the active area A/A.

The active area A/A may include a first area A1 having first resolution. The first area A1 may be located in an upper central portion of the active area A/A, and in some cases, may be located to adjoin the boundary of the active area A/A.

In addition, a portion of the active area A/A other than the first area A1 may have second resolution higher than the first resolution.

For example, a second area A2 having the second resolution may be located on one side of the first area A1. A third area A3 having the second resolution may be located on the other side of the first area A1.

The first area A1, the second area A2, and the third area A3 may be areas driven through the same gate lines GL.

In addition, the remaining portions of the active area A/A, except for the first area A1, the second area A2, and the third area A3, may be referred to as a fourth area A4. The fourth area A4 may have the second resolution the same as that of the second area A2 and the third area A3.

The first area A1 has the first resolution lower than that of the second area A2, the third area A3, and the fourth area A4. As in the illustration of FIG. 3, a portion of the first area A1 may be a transparent area. In addition, in a case in which the second area A2 or the like includes a transparent area, the ratio of the transparent area of the first area A1 may be greater than the transparent area of the second area A2 or the like.

Since the first area A1 includes the transparent area and has relatively high transmissivity, the optical sensor, such as a camera sensor or a proximity sensor, may be disposed in the first area A1.

For example, the optical sensor may be disposed on a surface opposite to a surface on which the display panel 110 displays images. Such an optical sensor may be located in an area overlapping the first area A1 of the active area A/A.

Since the optical sensor is located in the first area A1 having higher transmissivity, the optical sensor may perform sensing while being located on the surface opposite to the surface on which images are displayed. In addition, since the optical sensor is located in the active area A/A, the non-active area N/A may be prevented from being increased by the optical sensor that would otherwise be disposed therein.

As described above, embodiments provide a scheme for easily disposing the optical sensor in the active area A/A by reducing the resolution and increasing the transmissivity of a portion of the active area A/A.

In addition, the area having the first resolution and the area having the second resolution in the active area A/A may be driven through different gate lines GL. In this manner, a scheme for reducing a difference in the image quality between the areas having different resolutions by performing independent data compensation according to the area may be provided.

Figure 5:
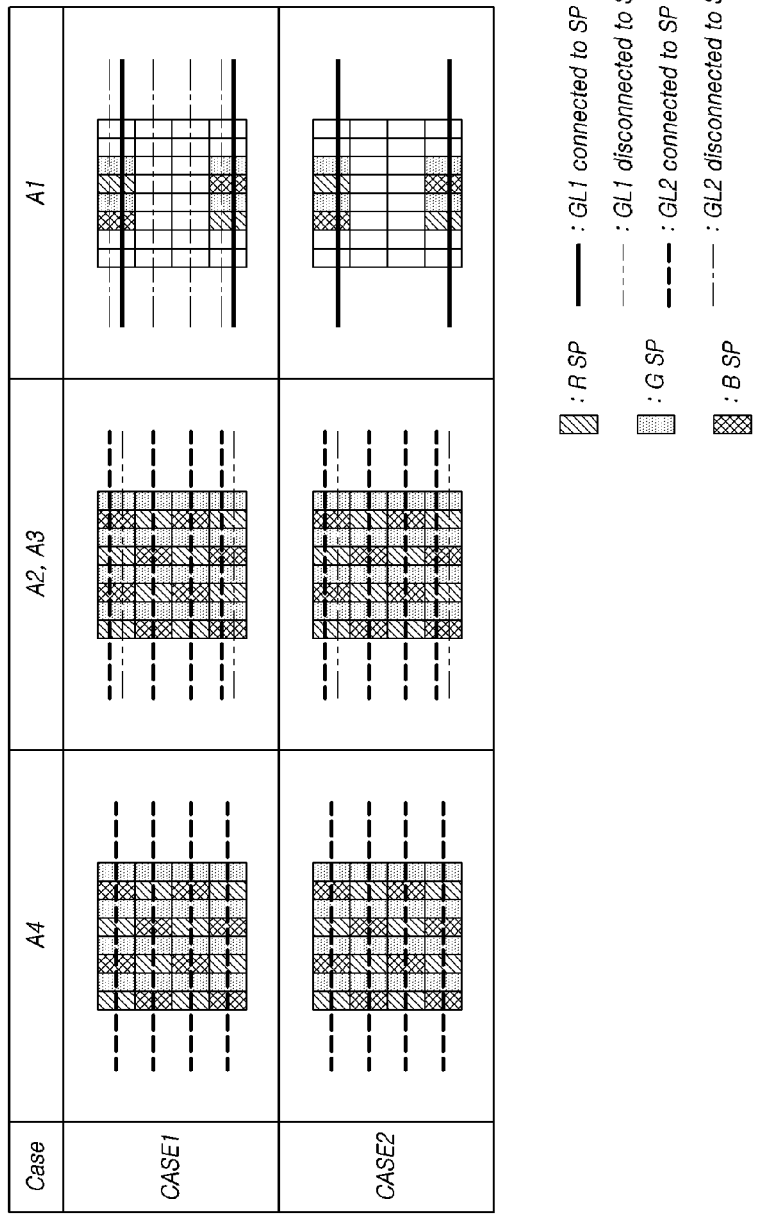

FIGS. 4 and 5 illustrate a structure in which gate lines GL for driving subpixels SP in the first area A1 and subpixels SP in the areas other than the first area A1 are disposed in the active area A/A of the display device 100 according to embodiments.

Referring to FIG. 4, the active area A/A of the display panel 110 may include the first area A1 having the first resolution and the second area A2, the third area A3, and the fourth area A4 having the second resolution higher than the first resolution.

A first gate driver 121 may be disposed on one side of the active area A/A to drive a plurality of first gate lines GL1 connected to the subpixels SP in the first area A1. A second gate driver 122 may be disposed to drive a plurality of second gate lines GL2 connected to the second area A2, the third area A3, and the fourth area A4.

Here, the first gate lines GL1 and the second gate lines GL2 may extend in a single direction (e.g. a horizontal direction). In addition, the first gate lines GL1 and the second gate lines GL2 may overlap at least one area among the first area A1, the second area A2, and the third area A3 located in the upper portion of the active area A/A.

For example, the first gate lines GL1 may overlap the first area A1, the second area A2, and the third area A3. In addition, the first gate lines GL1 may be electrically connected to circuit elements disposed in the subpixels SP of the first area A1 while not being connected to circuit elements disposed in the subpixels SP of the second area A2 and the third area A3.

In addition, the second gate lines GL2 may overlap the first area A1, the second area A2, and the third area A3. In addition, the second gate lines GL2 may be electrically connected to the circuit elements disposed in the subpixels SP of the second area A2 and the third area A3, instead of being connected to circuit elements disposed in the subpixels SP of the first area A1.

Here, the first area A1 has resolution lower than that of the second area A2 or the third area A3. Thus, the first gate lines GL1 for driving the subpixels SP of the first area A1 may be disposed in a smaller number than the second gate lines GL2 for driving the subpixels SP of the second area A2 and the third area A3. That is, the greatest distance between the adjacent first gate lines GL1 may be greater than the greatest distance between the adjacent second gate lines GL2.

As described above, the gate lines GL for driving the first area A1 having the first resolution may be disposed separately from the gate lines GL for driving the second area A2 and the third area A3 having the second resolution higher than the first resolution.

Accordingly, the subpixels SP of the second area A2 and the third area A3 may be driven by scan signals G(1), G(2), G(3), and the like output from the second gate driver 122. Since the subpixels SP of the first area A1 are driven by scan signals G(k), G(k+1), and the like, the subpixels SP of the first area A1 may be driven independently of the subpixels SP of the second area A2.

Since the subpixels SP of the first area A1 are driven independently of the subpixels SP of the second area A2 and the third area A3, compensation for the data voltage Vdata supplied to the subpixels SP of the first area A1 may be performed separately from compensation for the data voltage Vdata supplied to the subpixels SP of the second area A2 or the third area A3.

For example, the level of the data voltage Vdata supplied to the subpixels SP of the first area A1 may be set to be higher than the level of the data voltage Vdata supplied to the subpixels SP of the second area A2 or the like.

Due to the higher level of the data voltage Vdata supplied to the subpixels SP of the first area A1, the luminance of the first area A1 having lower resolution than that of the second area A2 or the third area A3 may be increased. Accordingly, a difference between the quality of images displayed by the first area A1 and the quality of images displayed by the second area A2 or the like may be reduced or removed.

In addition, the first gate lines GL1 and the second gate lines GL2 may be disposed in the upper portion of the active area A/A, with a variety of structures depending on the arrangement structure of the first gate driver 121 and the second gate driver 122.

Referring to CASE1 in FIG. 5, only the second gate lines GL2 may be disposed in the fourth area A4 located in the lower portion of the active area A/A. In addition, the second gate lines GL2 may be electrically connected to the circuit elements disposed in the subpixels SP of the fourth area A4.

The first gate lines GL1 and the second gate lines GL2 may be disposed in the second area A2 and the third area A3 among the upper areas of the active area A/A. Here, the second gate lines GL2 may be electrically connected to the circuit elements disposed in the subpixels SP of the second area A2 and the third area A3. In addition, the first gate lines GL1 may not be electrically connected to the circuit elements disposed in the subpixels SP of the second area A2 and the third area A3. That is, the first gate lines GL1 may be disposed to extend through the second area A2 and the third area A3 without being electrically connected to the circuit elements disposed in the subpixels SP of the second area A2 and the third area A3.

The first gate lines GL1 and the second gate lines GL2 may be disposed in the first area A1 of the active area A/A. The first gate lines GL1 may be electrically connected to the circuit elements disposed in the subpixels SP of the first area A1. In addition, the second gate lines GL2 may be disposed to extend through the first area A1 without being electrically connected to the circuit elements disposed in the subpixels SP of the first area A1.

As in CASE1 of FIG. 5, since the first gate lines GL1 driving the subpixels SP of the first area A1 are disposed separately, the difference between the quality of images of the first area A1 having lower resolution and the quality of images of the surrounding areas may be reduced or removed.

In addition, the second gate lines GL2 driving the subpixels SP of the second area A2 and the third area A3 extend through the first area A1 between the second area A2 and the third area A3, the scan signal driving the subpixels SP of the second area A2 and the third area A3 may be supplied in a dual feeding manner. That is, the scan signal driving the second gate lines GL2 may be supplied from both sides of the active area A/A to prevent a difference in the waveform of the scan signal depending on the position of the subpixels SP.

In addition, to further increase the transmissivity of the first area A1, the gate lines GL for driving the subpixels SP of the second area A2 and the third area A3 may be disposed separately.

Referring to CASE2 in FIG. 5, in the same manner as in CASE1, only the second gate lines GL2 may be disposed in the fourth area A4, and the first gate lines GL1 and the second gate lines GL2 may be disposed in the second area A2 and the third area A3.

Here, only the first gate lines GL1 may be disposed in the first area A1, but the second gate lines GL2 may not be disposed in the first area A1.

That is, the second gate lines GL2 driving the second area A2 may be disposed separately from the second gate lines GL2 driving the third area A3. Accordingly, the subpixels SP of the second area A2 may be electrically connected to gate lines GL different from those to which the subpixels SP of the third area A3 are electrically connected and may be driven by a gate driver 120 different from that by which the subpixels SP of the third area A3 is driven.

Since the second gate lines GL2 for driving the second area A2 are disposed separately from the second gate lines GL2 for driving the third area A3 as described above, the second gate lines GL2 may not be disposed in the first area A1. In addition, the removal of the second gate lines GL2 passing through the first area A1 may further increase the transmissivity of the first area A1.

In addition, according to embodiments, the first gate lines GL1 for driving the first area A1 of the active area A/A may extend in a direction intersecting the second gate lines GL2, such that the driving of the first area A1 and the placement of the first gate driver 121 may be further facilitated.

Figure 6:
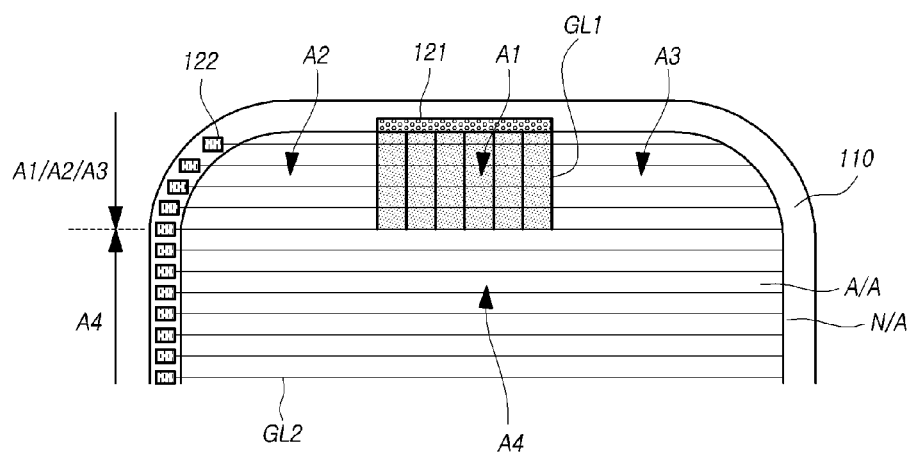
FIGS. 6 and 7 illustrate another structure in which the subpixels of the first area and the gate lines for driving the subpixels of other areas than the first area are disposed in the active area of the display device according to embodiments.
Figure 7:
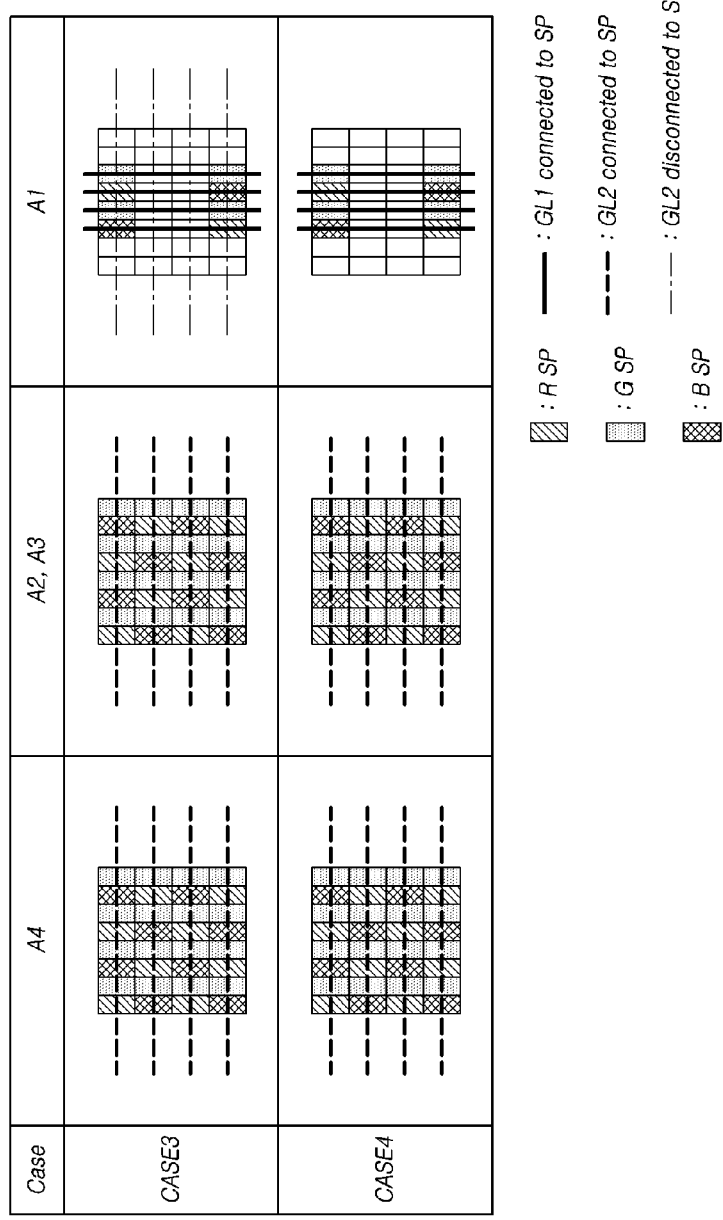

FIGS. 6 and 7 illustrate another structure in which the subpixels SP of the first area A1 and the gate lines GL for driving the subpixels SP of other areas than the first area A1 are disposed in the active area A/A of the display device 100 according to embodiments.

Referring to FIG. 6, the active area A/A of the display panel 110 may include the first area A1 having first resolution and the second area A2, the third area A3, and the fourth area A4 having second resolution higher than the first resolution.

The first gate driver 121 driving the subpixels SP of the first area A1 may be disposed on a first side of (e.g. above) the active area A/A. In addition, the second gate driver 122 driving the second area A2, the third area A3, and the fourth area A4 may be disposed on a second side (e.g. to the left) of the active area A/A.

Since the first gate driver 121 is disposed above the active area A/A, an area to the left of the active area A/A, in which the second gate driver 122 is disposed, may not be required for an additional area for the placement of the first gate driver 121. Thus, the separate first gate driver 121 driving the first area A1 may be easily disposed.

In addition, since the first gate driver 121 is disposed above the active area A/A, the first gate lines GL1 connected to the circuit elements disposed in the subpixels SP of the first area A1 may extend in a single direction (e.g. a vertical direction). In addition, the second gate lines GL2 for driving the second area A2 and the third area A3 may extend in a direction intersecting the first gate lines GL1 (e.g. a horizontal direction).

Since the first gate lines GL1 connected to the circuit elements disposed in the subpixels SP of the first area A1 located in the upper central portion of the active area A/A extend in the vertical direction, the first gate lines GL1 may not be disposed in either the second area A2 or the third area A3.

That is, the first gate lines GL1 separately disposed for the driving of the first area A1 may only be disposed in the first area A1. Thus, the first gate lines GL1 may not be unnecessarily disposed in the second area A2 or the like.

In addition, since the first area A1 is driven through the separately-disposed first gate lines GL1, compensation for the data voltage Vdata supplied to the subpixels SP of the first area A1 may be performed separately, thereby reducing or removing the difference between the quality of image of the first area A1 and the quality of image of the surrounding areas.

Here, the second gate lines GL2 may be electrically connected to the circuit elements disposed in the subpixels SP of the second area A2 and the third area A3. Thus, the second gate lines GL2 may be disposed in the second area A2 and the third area A3, and may overlap the first area A1 located between the second area A2 and the third area A3. In addition, the second gate lines GL2 may not be electrically connected to the circuit elements disposed in the subpixels SP of the first area A1.

Referring to CASE3 in FIG. 7, the second gate lines GL2 are disposed in the fourth area A4 located in the lower portion of the active area A/A. The second gate lines GL2 may be disposed in the second area A2 and the third area A3 among the upper areas of the active area A/A. Accordingly, the second area A2, the third area A3, and the fourth area A4 may be driven through the second gate lines GL2.

The first gate lines GL1 may be disposed in the first area A1 of the active area A/A. In addition, the first gate lines GL1 may extend in a direction intersecting the second gate lines GL2, and may be electrically connected to the circuit elements disposed in the subpixels SP of the first area A1.

The second gate lines GL2 may be disposed in the first area A1, and may not be electrically connected to the circuit elements disposed in the subpixels SP of the first area A1. That is, the second gate lines GL2 may extend in a direction intersecting the first gate lines GL1 in the first area A1, so as to extend through the first area A1.

Since the first gate lines GL1 and the second gate lines GL2 extend in intersecting directions in the first area A1, at least a portion of the first gate lines GL1 may be disposed on a different layer from the second gate lines GL2.

For example, the portions of the first gate lines GL1, other than the portions of the first gate lines GL1 forming the gate electrodes of the circuit elements disposed in the subpixels SP of the first area A1, may be disposed on a layer on which the data lines DL are disposed. Accordingly, a short-circuit may be prevented from occurring in an area in which the first gate lines GL1 intersect the second gate lines GL2.

Since the first gate lines GL1 and the second gate lines GL2 extend in the intersecting direction, the placement of the first gate driver 121 and the first gate lines GL1 for driving the first area A1 may be facilitated. In addition, the second gate lines GL2 for driving the second area A2 and the third area A3 may provide a structure able to operate in a dual feeding manner.

In addition, referring to CASE4 in FIG. 7, the first gate lines GL1 may extend in the first area A1 of the active area A/A, in a direction intersecting the second gate lines GL2. The first gate lines GL1 may be electrically connected to the circuit elements disposed in the subpixels SP of the first area A1.

Here, since the first area A1 includes the transparent area and has low resolution, the first gate lines GL1 may only be disposed in a portion of the first area A1, depending on the shape of the subpixels SP disposed in the first area A1.

In addition, none of the second gate lines GL2 may be disposed in the first area A1. The second gate lines GL2 may be disposed such that the second gate lines GL2 for driving the second area A2 are disposed separately from the second gate lines GL2 for driving the third area A3, with none of the second gate lines GL2 being disposed in the first area A1.

Since none of the second gate lines GL2 may be disposed in the first area A1, the transmissivity of the first area A1 may be further increased, and the first gate lines GL1 and the second gate lines GL2 may be disposed on the same layer.

Figure 8:
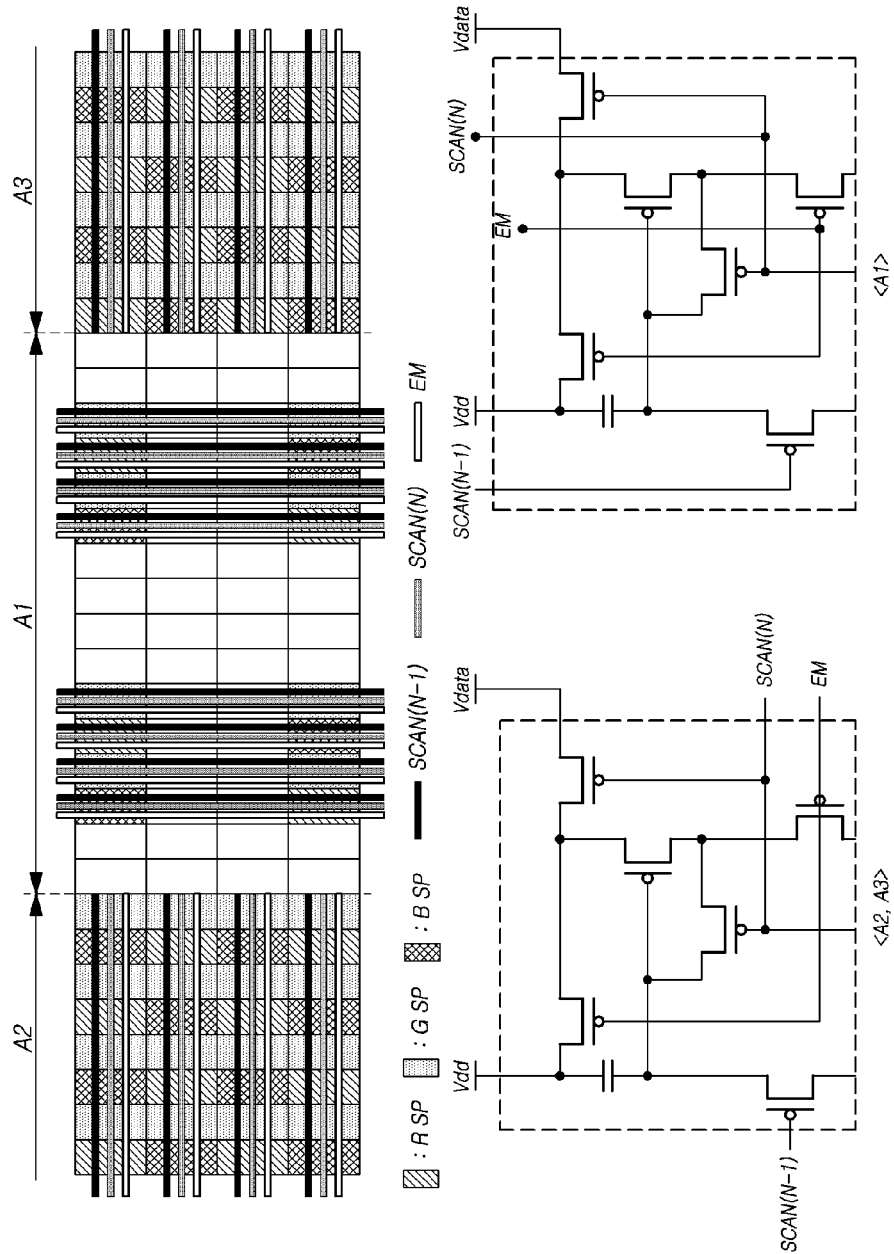
FIG. 8 illustrates a specific structure of CASE4 illustrated in FIG. 7 according to embodiments.

FIG. 8 illustrates a specific structure of CASE4 illustrated in FIG. 7.

Referring to FIG. 8, in the second area A2 and the third area A3 among the upper areas of the active area A/A, the second gate lines GL2, through which the scan signals SCAN(N−1), SCAN(N), and EM and the like are applied, may extend in a horizontal direction.

In the first area A1, the first gate lines GL1, through which the scan signals SCAN(N−1), SCAN(N), and EM and the like are applied, may extend in a vertical direction intersecting the second gate lines GL2. In addition, none of the second gate lines GL2 may be disposed in the first area A1.

Since the gate lines GL for driving the first area A1 having low resolution and high transmissivity are disposed separately from the gate lines GL for driving the second area A2 and the third area A3 having high resolution and low transmissivity, compensation for data in the first area A1 may be facilitated, thereby reducing or removing the difference in the image quality between the first area A1 and the surrounding areas.

In addition, since the first gate lines GL1 for driving the first area A1 extend in a direction intersecting the second gate lines GL2, the placement of the first gate driver 121 and the first gate lines GL1 for driving the first area A1 may be facilitated.

In addition, the second gate lines GL2 may only be disposed in the areas except for the first area A1 in some cases, such that the transmissivity of the first area A1 is further increased.

Here, the subpixels SP of the first area A1 having low resolution to increase transmissivity may be disposed in a variety of forms, in consideration of the transmissivity, the image quality, the arrangement structure of the gate lines GL, and the like.

Figure 9A:
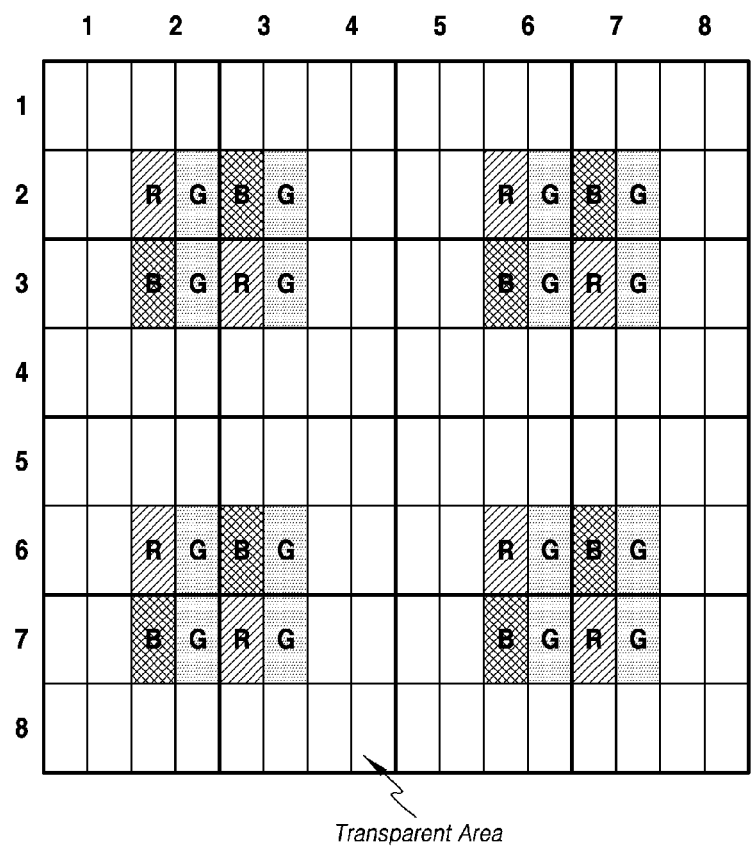
Figure 9B:
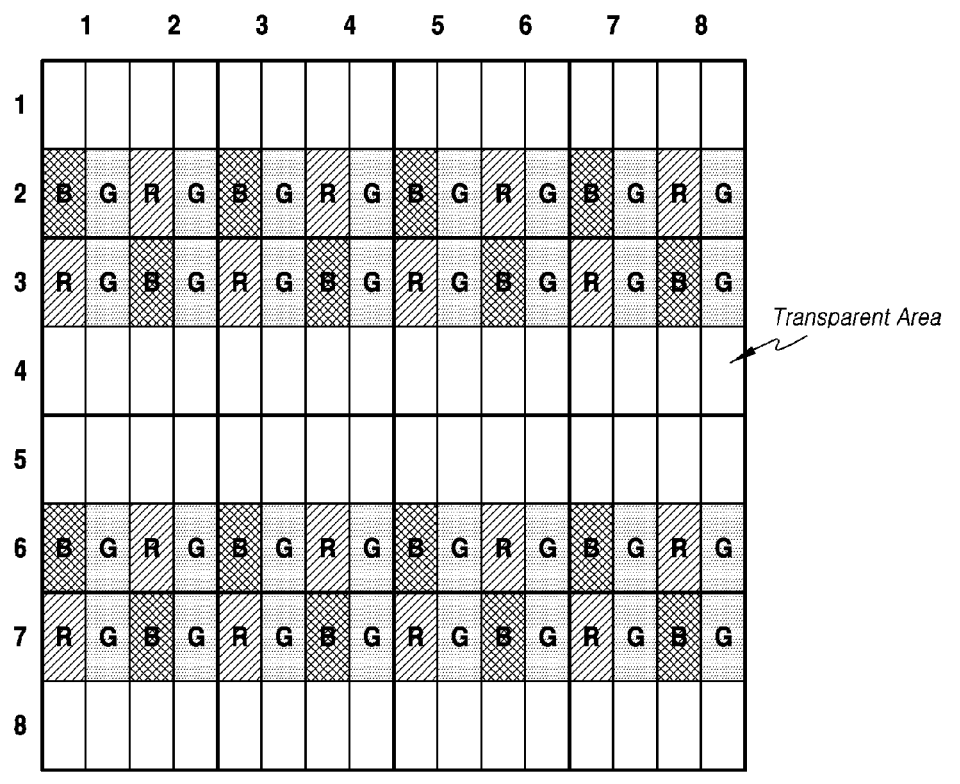
Figure 9C:
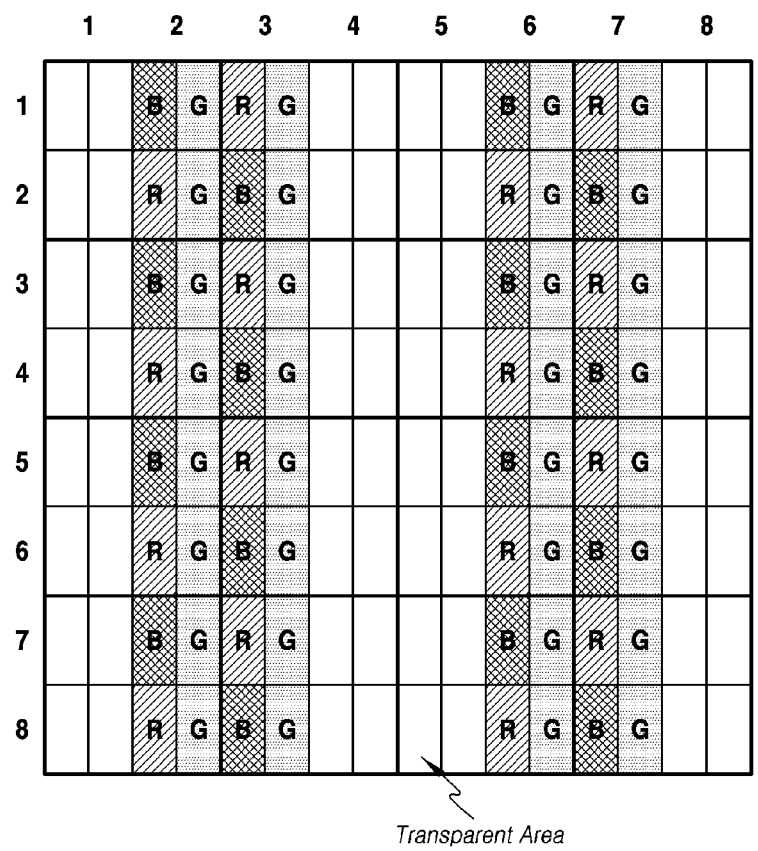

FIGS. 9A to 9C illustrate arrangement structures of the subpixels SP in the first area A1 of the active area A/A of the display device 100 according to embodiments.

Referring to FIG. 9A, in the first area A1, the subpixels SP may be disposed with low resolution to have high transmissivity, such that a sensing operation using an optical sensor may be enabled.

For example, as in the illustration of FIG. 9A, in a case in which a single red subpixel R SP, a single blue subpixel B SP, and two green subpixels G SP constitute a single pixel, emitting devices or the like may only be disposed in four (4) pixels from among sixteen (16) pixels to display images.

In this case, the first gate lines GL1 may be disposed the first gate lines GL1 may be disposed to extend through the area in which image-displaying pixels are disposed. In addition, none of the second gate lines GL2 may be disposed in the first area A1 or the second gate lines GL2 may be disposed to extend through not only the image-displaying pixels but also the transparent area.

Increasing the ratio of the transparent area in the first area A1 as described above may increase the sensing performance of the optical sensor located to overlap the first area A1.

In addition, the ratio of the image-displaying pixels in the first area A1 may be increased by an insignificant value to improve the image quality of the first area A1, while the sensing using the optical sensor is still allowed.

Referring to FIGS. 9B and 9C, the emitting devices or the like may be disposed in eight (8) pixel areas from among the 16 pixel areas to display images.

In the illustration of FIG. 9B, the pixels in which the emitting devices or the like are disposed are connected in a horizontal direction. Such a pixel structure may be suitable for a situation in which the first gate lines GL1 and the second gate lines GL2, having one of the above-described arrangement structures of the first gate lines GL1 and the second gate lines GL2, extend in a single direction.

In addition, in the illustration of FIG. 9C, the pixels in which the emitting devices or the like are disposed are connected in a vertical direction. Such a pixel structure may be suitable for a situation in which the first gate lines GL1 and the second gate lines GL2 extend in intersecting directions, i.e. the first gate lines GL1 extend to intersect the second gate lines GL2.

In the illustration of FIG. 9B or 9C, in a case in which the second gate lines GL2 are disposed separately in the second area A2 and the third area A3 without being disposed in the first area A1, a structure in which neither the first gate lines GL1 nor the second gate lines GL2 are disposed in the transparent area of the first area A1 may be provided. Accordingly, the transmissivity of the first area A1 may be maximized while the decrease of the resolution of the first area A1 is minimized.

According to embodiments as described above, since the low-resolution area is disposed in a portion of the active area A/A, the display device 100 may have an optical sensor disposed in the low-resolution area, on a surface of the low-resolution area opposite to an image display surface of the low-resolution area, while being able to perform sensing.

Accordingly, the optical sensor required for the display device 100 may be easily disposed in the display panel 110 while preventing an increase in the non-active area N/A of the display panel 110.

In addition, since the first gate lines GL1 for driving the low-resolution area is disposed separately from the second gate lines GL2 for driving the high-resolution surrounding areas, compensation for the low-resolution area may be facilitated, thereby reducing or removing the difference in the image quality between the low-resolution area and the high-resolution areas.

In addition, due to the arrangement structure in which the first gate lines GL1 for driving the low-resolution area extend in a direction intersecting the second gate lines GL2 for driving the high-resolution surrounding areas, the replacement of the first gate driver 121 and the first gate lines GL1, separately disposed for the driving of the low-resolution area, may be facilitated.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
   an active area including a first area having a first resolution and a second area located on one side of the first area and having a second resolution higher than the first resolution;
   a plurality of first gate lines electrically connected to circuit elements disposed in subpixels of the first area and extending in a first direction; and
   a plurality of second gate lines electrically connected to circuit elements disposed in subpixels of the second area and extending in a second direction intersecting the first direction,
   wherein a portion of the plurality of second gate lines overlaps the first area and is insulated from the circuit elements disposed in the subpixels of the first area.

2. The display device according to claim 1, wherein the plurality of first gate lines are disposed in an area except for the second area.

3. The display device according to claim 1, wherein the plurality of second gate lines are disposed in an area except for the first area.

4. The display device according to claim 1, wherein the active area further includes a third area located on another side of the first area and having the second resolution.

5. The display device according to claim 4, further comprising a plurality of third gate lines electrically connected to circuit elements disposed in subpixels of the third area and separated from the plurality of second gate lines.

6. The display device according to claim 5, wherein the plurality of third gate lines are disposed in an area except for the first area and the second area.

7. The display device according to claim 4, wherein the plurality of second gate lines are electrically connected to circuit elements disposed in subpixels of the third area.

8. The display device according to claim 1, further comprising:
   a first gate driver located on a first side of the active area to drive the plurality of first gate lines; and
   a second gate driver located on a second side of the active area different from the first side to drive the plurality of second gate lines.

9. The display device according to claim 1, wherein the first area includes a transparent area, and at least a plurality of gate lines among the plurality of first gate lines and the plurality of second gate lines are disposed in an area except for the transparent area.

10. The display device according to claim 1, further comprising at least one optical sensor disposed in an area overlapping the first area and located on a side opposite to a surface of the first area on which an image is displayed.

11. A display device comprising:
an active area including a first area having a first resolution, a second area located on one side of the first area and having a second resolution higher than the first resolution, and a third area located on another side of the first area and having the second resolution;
a plurality of first gate lines electrically connected to circuit elements disposed in subpixels of the first area and insulated from circuit elements disposed in subpixels of the second area and the third area;
a plurality of second gate lines insulated from the circuit elements disposed in the subpixels of the first area and electrically connected to the circuit elements disposed in the subpixels of at least one area of the second area and the third area; and
a plurality of third gate lines electrically connected to the circuit elements disposed in subpixels of the third area and disposed in an area except for the first area and the second area,
wherein the plurality of second gate lines are electrically connected to the circuit elements disposed in the subpixels of the second area and insulated from the circuit elements disposed in the subpixels of the third area.

12. The display device according to claim 11, wherein a portion of the plurality of first gate lines overlaps at least one area of the second area and the third area.

13. The display device according to claim 11, wherein a portion of the plurality of second gate lines overlaps the first area.

14. The display device according to claim 11, wherein at least one subpixel among subpixels of the first area, the second area, and the third area overlap the plurality of first gate lines and the plurality of second gate lines.

15. The display device according to claim 11, wherein a greatest distance between two adjacent first gate lines among the plurality of first gate lines is greater than a greatest distance between two adjacent second gate lines among the plurality of second gate lines.

16. The display device according to claim 11, wherein the plurality of second gate lines are electrically connected to the circuit elements disposed in the subpixels of the second area and the third area.

17. The display device according to claim 11, wherein the plurality of second gate lines are disposed in an area except for the first area and the third area.

* * * * *